United States Patent
Sakai et al.

(10) Patent No.: US 12,035,591 B2
(45) Date of Patent: Jul. 9, 2024

(54) ARRANGEMENT OF PIXEL CIRCUTS IN A DISPLAY DEVICE

(71) Applicant: SHARP KABUSHIKI KAISHA, Sakai (JP)

(72) Inventors: Tamotsu Sakai, Osaka (JP); Fumiyuki Kobayashi, Sakai (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 477 days.

(21) Appl. No.: 17/603,236

(22) PCT Filed: Apr. 26, 2019

(86) PCT No.: PCT/JP2019/018039
§ 371 (c)(1),
(2) Date: Oct. 12, 2021

(87) PCT Pub. No.: WO2020/217485
PCT Pub. Date: Oct. 29, 2020

(65) Prior Publication Data
US 2022/0190097 A1  Jun. 16, 2022

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02); *H10K 59/1216* (2023.02)

(58) Field of Classification Search
CPC . H10K 59/1213; H10K 59/1216; H10K 59/35
See application file for complete search history.

(56) References Cited

U.S. PATENT DOCUMENTS

| | | |
|---|---|---|
| 2013/0234917 A1 | 9/2013 | Lee |
| 2014/0071030 A1 | 3/2014 | Lee |
| 2018/0069057 A1 | 3/2018 | Lee |
| 2019/0333970 A1 | 10/2019 | Lee |
| 2020/0365675 A1* | 11/2020 | Kim ................... H10K 59/1213 |
| 2020/0394955 A1 | 12/2020 | Lee |

FOREIGN PATENT DOCUMENTS

JP  2018-120864 A  8/2018

* cited by examiner

*Primary Examiner* — Wasiul Haider
(74) *Attorney, Agent, or Firm* — ScienBiziP, P.C.

(57) ABSTRACT

A first pixel circuit and a third pixel circuit are connected to a first scan signal line, and a second pixel circuit and a fourth pixel circuit are connected to a second scan signal line. Of two first pixel circuits connected to a common, first scan signal line, a capacitive element in the first pixel circuit in a group that is located farther in a row direction from a center of a display area has a larger capacitance value than does a capacitive element in the first pixel circuit in a group that is located closer.

17 Claims, 12 Drawing Sheets

ARRANGEMENT OF PIXEL CIRCUTS IN A DISPLAY DEVICE

TECHNICAL FIELD

The disclosure relates to display devices.

TECHNICAL FIELD

Patent Literature 1 discloses a structure including rows of alternate red and blue subpixels and rows of green subpixels.

CITATION LIST

Patent Literature

Patent Literature 1: Japanese Unexamined Patent Application Publication, Tokukai, No. 2018-120864

SUMMARY

Technical Problem

The arrangement of subpixels disclosed in Patent Literature 1 presents difficulty in making good white balance settings (the display tends to appear colored in a white display) when a red and a blue subpixel are connected to a single data signal line and a green subpixel is connected to another data signal line.

Solution to Problem

The disclosure, in an aspect thereof, is directed to A display device having a display area, a frame area, and a terminal area along an edge of the frame area, the display device including: a plurality of data signal lines extending in a column direction; a plurality of scan signal lines extending in a row direction so as to intersect with the plurality of data signal lines; a scan control circuit in the frame area along at least one of column-wise extending edges of the display area, the scan control circuit being configured to feed a scan signal to the plurality of scan signal lines; and a plurality of pixel circuits each associated with a different one of intersections of the plurality of data signal lines and the plurality of scan signal lines, each of the plurality of pixel circuits including: a light-emitting element; a drive transistor configured to control a current in the light-emitting element; and a capacitive element connected to a control terminal of the drive transistor to retain a data voltage, wherein the plurality of pixel circuits includes a plurality of groups each including: a first pixel circuit configured to emit light of a first color; a second pixel circuit located adjacent to the first pixel circuit and configured to emit light of a second color that differs from the first color; a third pixel circuit located adjacent to the first pixel circuit and configured to emit light of a third color that differs from the first color and the second color; and a fourth pixel circuit located adjacent to the third pixel circuit and configured to emit light of the third color, in each of the plurality of groups, the first pixel circuit and the second pixel circuit are connected to a first data signal line, the third pixel circuit and the fourth pixel circuit are connected to a second data signal line, the first pixel circuit and the third pixel circuit are connected to a first scan signal line, and the second pixel circuit and the fourth pixel circuit are connected to a second scan signal line, and of those two of the first pixel circuits which are included in different ones of the plurality of groups and connected to a common one of the first scan signal lines, the capacitive element in the first pixel circuit that is located farther in the row direction from a center of the display area has a larger capacitance value than does the capacitive element in the first pixel circuit that is located closer in the row direction to the center of the display area.

Advantageous Effects of Disclosure

The disclosure, in an aspect thereof, makes it easier to make white balance settings and restrains the display from appearing colored in a white display.

DESCRIPTION OF EMBODIMENTS

Figure 1:
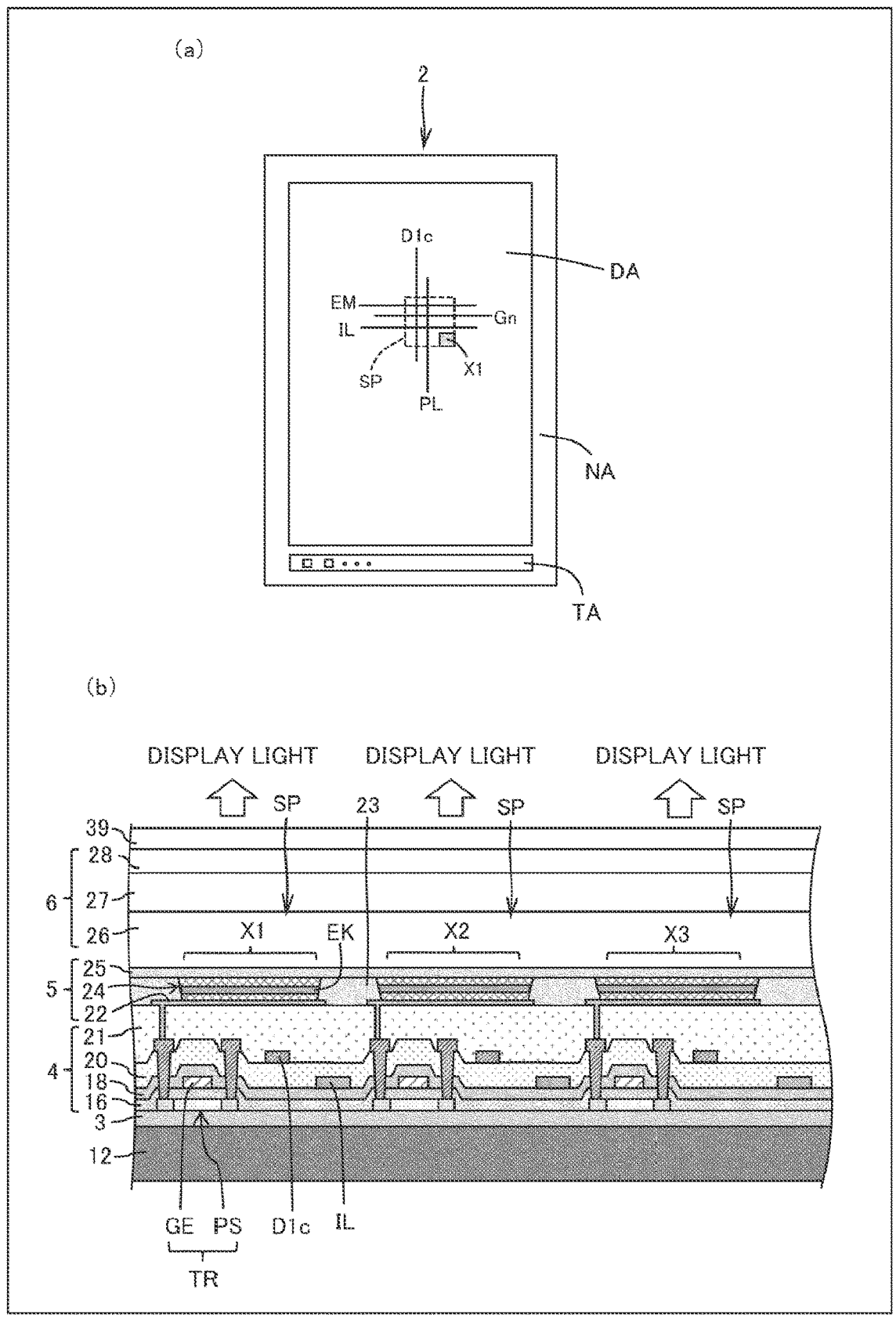
FIG. 1(*a*) is a schematic plan view of a structure of a display device in accordance with the present embodiment, and FIG. 1(*b*) is a cross-sectional view of the structure of the display device.

The following will describe embodiments with reference to attached drawings. FIG. 1(*a*) is a schematic plan view of a structure of a display device in accordance with the present embodiment. FIG. 1(*b*) is a cross-sectional view of the structure of the display device.

Referring to FIG. 1, a display device 2 includes a barrier layer 3, a thin film transistor layer 4, a top-emission (light is emitted upwards) light-emitting element layer 5, and a sealing layer 6, all disposed in this sequence on a substrate 12. The display device 2 further includes a plurality of subpixels SP each including a self-luminous element in a display area DA. The display device 2 has a terminal area TA in a frame area NA surrounding the display area DA.

The substrate 12 is either a glass substrate or a flexible base member made primarily of a resin such as polyimide. The substrate 12 may be made of, for example, two polyimide films and an inorganic film interposed between these two polyimide films. The barrier layer (undercoat layer) 3 is an inorganic insulation layer preventing foreign materials such as water and oxygen from reaching the interior and may be made of, for example, silicon nitride or silicon oxide.

Referring to FIG. 1(b), the thin film transistor layer 4 includes: a semiconductor layer PS overlying the barrier layer 3; a gate insulation film 16 overlying the semiconductor layer PS; a first wiring layer (including gate electrodes GE) overlying the gate insulation film 16; a first interlayer insulation film 18 overlying the first wiring layer; a second wiring layer (including initialization power supply lines IL) overlying the first interlayer insulation film 18; a second interlayer insulation film 20 overlying the second wiring layer; a third wiring layer (including data signal lines D1c) overlying the second interlayer insulation film 20; and a planarization film 21 overlying the third wiring layer.

The semiconductor layer PS is made of, for example, a low-temperature polysilicon (LTPS) and includes transistors TR including the gate electrodes GE and the semiconductor layer PS. The semiconductor layer PS may include a conductor in the non-channel regions of the transistors.

The first wiring layer, the second wiring layer, and the third wiring layer are made of, for example, a monolayer or multilayered film of at least one of metals of aluminum, tungsten, molybdenum, tantalum, chromium, titanium, and copper.

The gate insulation film 16, the first interlayer insulation film 18, and the second interlayer insulation film 20 may be made of, for example, a silicon oxide (SiOx) film or a silicon nitride (SiNx) film formed by CVD or a stack of these films. The planarization film 21 may be made of, for example, an organic material, such as polyimide or an acrylic resin, that can be provided by printing or coating technology.

The light-emitting element layer 5 includes: first electrodes (lower electrodes) 22 overlying the planarization film 21; an insulating edge cover film 23 covering edges of the first electrodes 22; EL (electroluminescence) layers 24 overlying the edge cover film 23; and a second electrode (upper electrode) 25 overlying the EL layers 24. The edge cover film 23 is formed, for example, by patterning an applied organic material such as polyimide or an acrylic resin by photolithography.

Referring to FIG. 1, the light-emitting element layer 5 includes, for example, red light-emitting elements X1, blue light-emitting elements X2, and green light-emitting elements X3 formed therein. Each of these light-emitting elements includes one of the insular, first electrodes 22, one of the EL layers 24 (including a light-emitting layer EK), and the second electrode 25. The second electrode 25 is an electrode provided common to a plurality of light-emitting elements ("common electrode").

The light-emitting elements X1 to X3 may be, for example, OLEDs (organic light-emitting diodes) including an organic layer as a light-emitting layer or QLEDs (quantum-dot light-emitting diodes) including a quantum-dot layer as a light-emitting layer.

The EL layer 24 includes, for example, a stack of a hole injection layer, a hole transport layer, the light-emitting layer EK, an electron transport layer, and an electron injection layer that are provided in this sequence when viewed from below. The light-emitting layer is formed in an insular manner for each opening in the edge cover film 23 (i.e., for each subpixel) by vapor deposition, inkjet technology, or photolithography. Other layers are provided either in an insular manner or as a common layer across all the openings. One or more of the hole injection layer, the hole transport layer, the electron transport layer, and the electron injection layer may be omitted.

The first electrode 22 (anode) includes a stack of, for example, ITO (indium tin oxide) and either Ag (silver) or a Ag-containing alloy, so that the first electrode 22 can reflect light. The second electrode 25 (cathode) is made of, for example, a thin film of a metal such as a magnesium-silver alloy, so that the second electrode 25 can transmit light.

When the light-emitting elements X1 to X3 are OLEDs, holes and electrons recombine in the light-emitting layer EK due to a drive current that flows between the first electrode 22 and the second electrode 25, to produce excitons that transition to the ground state to emit light. When the light-emitting elements X1 to X3 are QLEDs, holes and electrons recombine in the light-emitting layer EK due to a drive current that flows between the first electrode 22 and the second electrode 25, to produce excitons that transition from the conduction band to the valence band of the quantum dots to emit light.

In FIG. 1(b), the sealing layer 6, covering the light-emitting element layer 5, prevents foreign materials such as water and oxygen from reaching the light-emitting element layer 5 and may be made of, for example, two inorganic sealing films 26 and 28 and an organic film 27 interposed between these two inorganic sealing films 26 and 28.

In the display area DA are there provided L scan signal lines, K data signal lines perpendicular to these scan signal lines, and L×K pixel circuits at the respective intersections of the data signal lines and the scan signal lines. This particular structure forms an L×K matrix of pixels in the display area DA.

Figure 2:
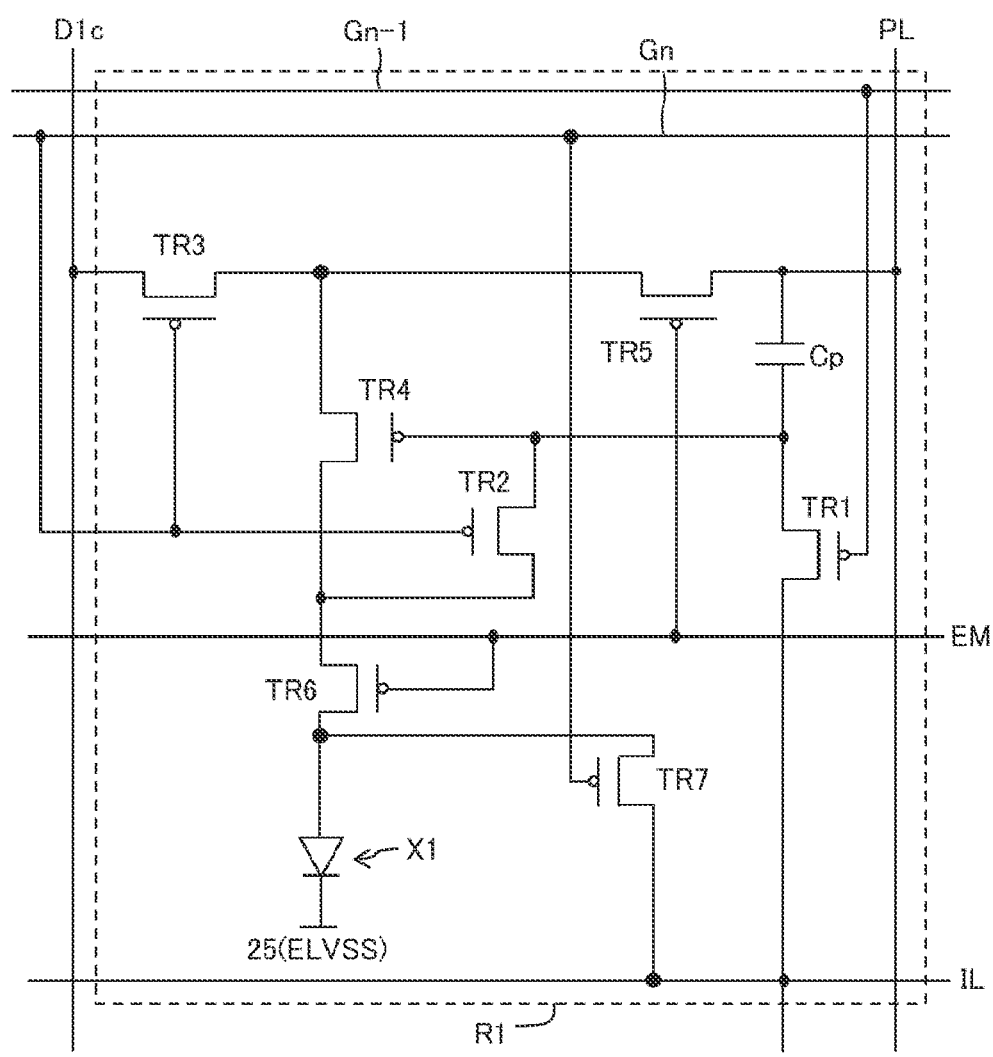
FIG. 2 is a circuit diagram of an exemplary pixel circuit.

FIG. 2 is a circuit diagram of an exemplary pixel circuit. A pixel circuit is provided to each subpixel SP in the display area DA in FIG. 1. The thin film transistor layer 4 includes formed therein this pixel circuit and wiring connected to the pixel circuit. FIG. 2 gives a mere example of the pixel circuit which may be configured in many various ways.

FIG. 2 shows a first pixel circuit R1 including: the light-emitting element X1; a capacitive element Cp; a first initialization transistor TR1 having a gate terminal thereof connected to a scan signal line Gn−1 (second scan signal line) of a preceding stage ((n−1)-th stage); a threshold value control transistor TR2 having a gate terminal thereof connected to a scan signal line Gn (first scan signal line) of the current stage (n-th stage); a write control transistor TR3 having a gate terminal thereof connected to the scan signal line Gn of the current stage (n-th stage); a drive transistor TR4 for controlling an electric current for the light-emitting element X1; a power supply transistor TR5 having a gate terminal thereof connected to a light-emission control line EM (n-th stage); a light emission control transistor TR6 having a gate terminal thereof connected to the light-emission control line EM (n-th stage); and a second initialization transistor TR7 having a gate terminal connected to the scan signal line Gn of the current stage (n-th stage). These transistors are, for example, P-channel transistors.

The drive transistor TR4 has a gate terminal thereof connected to a high-voltage power supply line PL via the capacitive element Cp and also to the initialization power supply line IL via the first initialization transistor TR1. The drive transistor TR4 has a source terminal thereof connected to a data signal line DL via the write control transistor TR3 and also to the high-voltage power supply line PL via the power supply transistor TR5. The drive transistor TR4 has a drain terminal thereof connected to the anode of the light-emitting element X1 via the light emission control transistor TR6 and also to the gate terminal of the drive transistor TR4 via the threshold value control transistor TR2. The light-emitting element X1 has an anode thereof connected to the initialization power supply line IL via the second initialization transistor TR7. The initialization power supply line IL and the second electrode 25 (common electrode) of the light-emitting element X1 are fed with, for example, the same low-voltage power supply (ELVSS).

Embodiment 1

Figure 3:
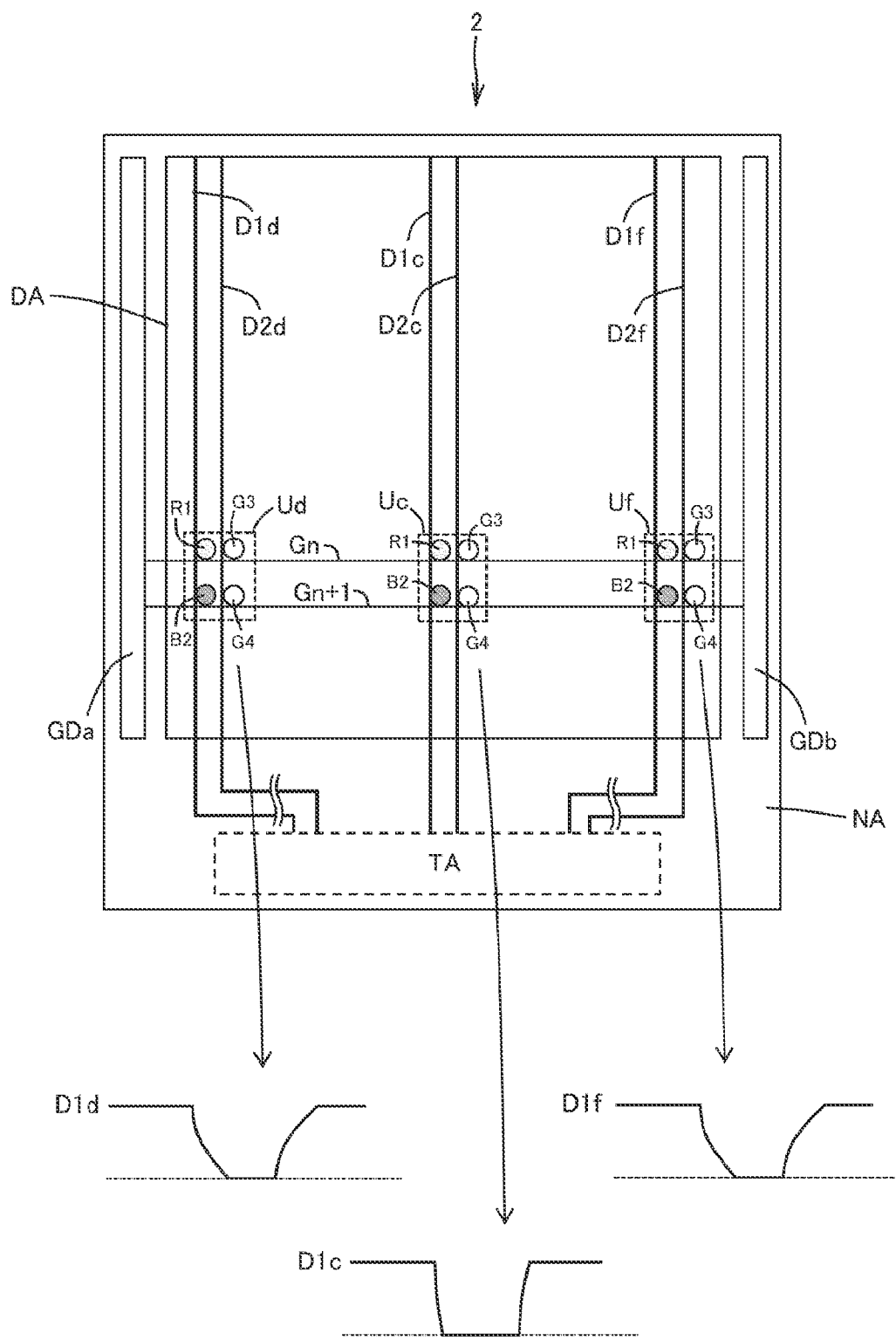
FIG. 3 is a set of diagrams of a structure of a display device in accordance with Embodiment 1 and data signal waveforms in the display device.

FIG. 3 is a set of diagrams of a structure of a display device in accordance with Embodiment 1 and signal waveforms in the display device. Referring to FIG. 3, in Embodiment 1, there are provided data signal lines D1c and D2c extending in the column direction and scan signal lines Gn (indicating the n-th row) and Gn+1 (indicating the (n+1)-th row) extending in the row direction so as to intersect with the data signal lines D1c and D2c. In a frame area NA, there are provided scan control circuits GDa and GDb on the two column-wise extending edges (two vertical edges) of the display area DA to feed a scan signal to the scan signal lines.

The display area DA includes groups (Uc, Ud, and Uf) each of a first pixel circuit R1, a second pixel circuit B2, a third pixel circuit G3, and a fourth pixel circuit G4. The first pixel circuit R1 emits light of a first color (e.g., red). The second pixel circuit B2 sits adjacent to the first pixel circuit R1 in the column direction and emits light of a second color (e.g., blue) that differs from the first color. The third pixel circuit G3 sits adjacent to the first pixel circuit R1 in the row direction and emits light of a third color (e.g., green) that differs from both the first color and the second color. The fourth pixel circuit G4 sits adjacent to the third pixel circuit G3 in the column direction and emits light of the third color (e.g., green).

In the group Uc, the first pixel circuit R1 and the second pixel circuit B2 are connected to the first data signal line D1c. The third pixel circuit G3 and the fourth pixel circuit G4 are connected to the second data signal line D2c. The first pixel circuit R1 and the third pixel circuit G3 are connected to the first scan signal line Gn. The second pixel circuit B2 and the fourth pixel circuit G4 are connected to the second scan signal line Gn+1.

In the group Ud, the first pixel circuit R1 and the second pixel circuit B2 are connected to a first data signal line D1d. The third pixel circuit G3 and the fourth pixel circuit G4 are connected to a second data signal line D2d. The first pixel circuit R1 and the third pixel circuit G3 are connected to the first scan signal line Gn. The second pixel circuit B2 and the fourth pixel circuit G4 are connected to the second scan signal line Gn+1.

In the group Uf, the first pixel circuit R1 and the second pixel circuit B2 are connected to a first data signal line D1f. The third pixel circuit G3 and the fourth pixel circuit G4 are connected to a second data signal line D2f. The first pixel circuit R1 and the third pixel circuit G3 are connected to the first scan signal line Gn. The second pixel circuit B2 and the fourth pixel circuit G4 are connected to the second scan signal line Gn+1.

The first scan signal line Gn has the ends thereof connected respectively to the two scan control circuits GDa and GDb sandwiching the display area DA. The second scan signal line Gn+1 has the ends thereof connected respectively to the scan control circuits GDa and GDb. The first data signal lines D1c and D1f and the second data signal lines D2c and D2f are connected to the terminal area TA via routing lines provided in the frame area NA.

Of the groups Uc, Ud, and Uf, the group Uc is located closer in the row direction to the center of the display area, and the groups Ud and Uf are located farther in the row direction from the center of the display area. In other words, of the groups Uc, Ud, and Uf, the groups Ud and Uf are located closer to an edge of the display area when viewed in the row direction, and the group Uc is located farther from the edges of the display area when viewed in the row direction.

For instance, when L=5120, K=3200, and the resolution is 300 ppi, the pixel circuits that are located farther in the row direction from the center of the display area, or closer in the row direction to the scan control circuits GDa and GDb, may be in some cases roughly referring to those pixel circuits (including the group Ud) in the first to 100th columns and those pixel circuits (including the group Uf) in the (K−99)-th to K-th column, as counted from an edge of the display area. The pixel circuits that are located closer in the row direction to the center of the display area, or farther in the row direction from the scan control circuits GDa and GDb, may be in some cases roughly referring to those pixel circuits (including the group Uc) in the 101th to (K−100)-th columns.

Figure 4:
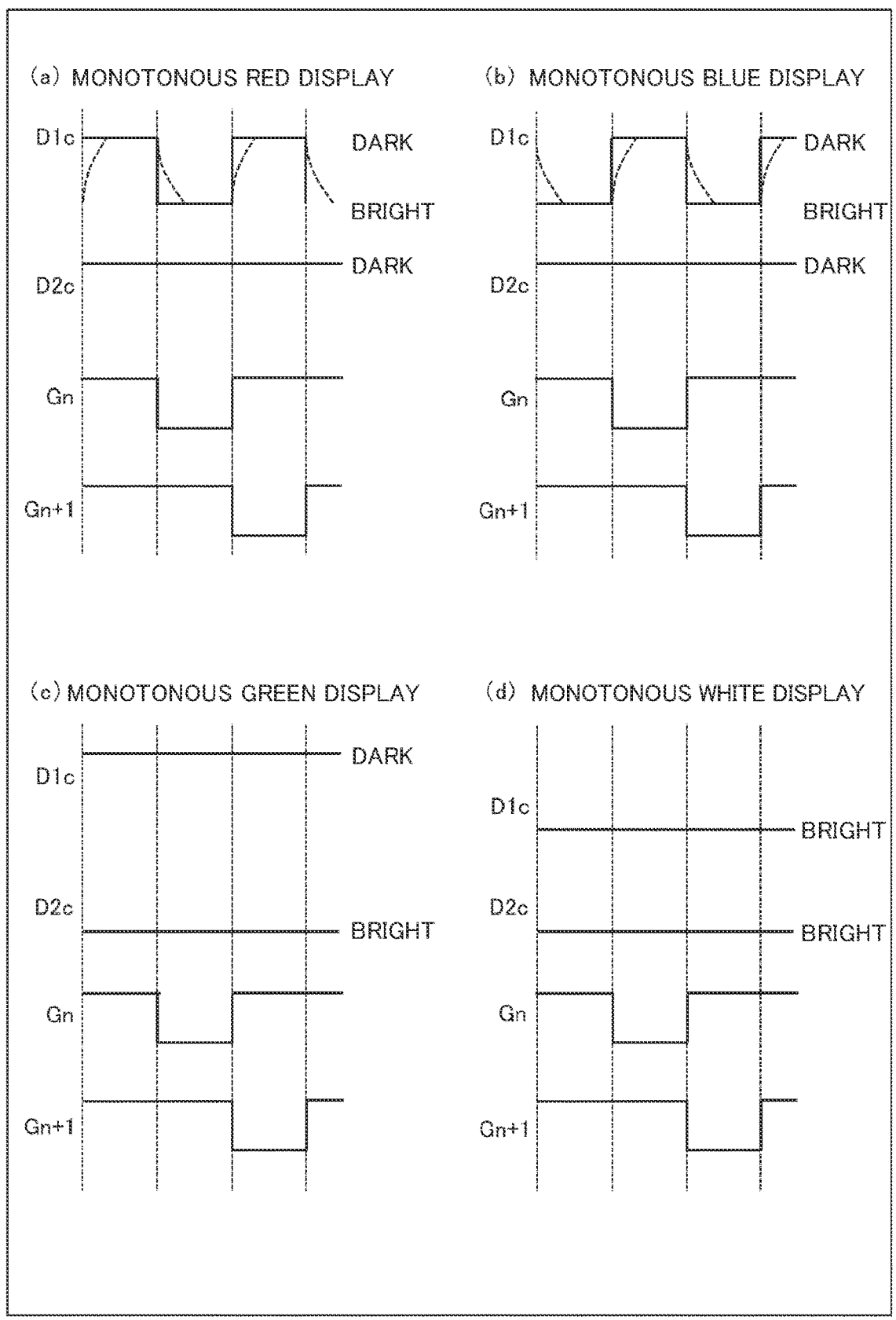
FIG. 4 is a set of timing charts representing a driving scheme for producing a monotonous display in a display area.
Figure 5:
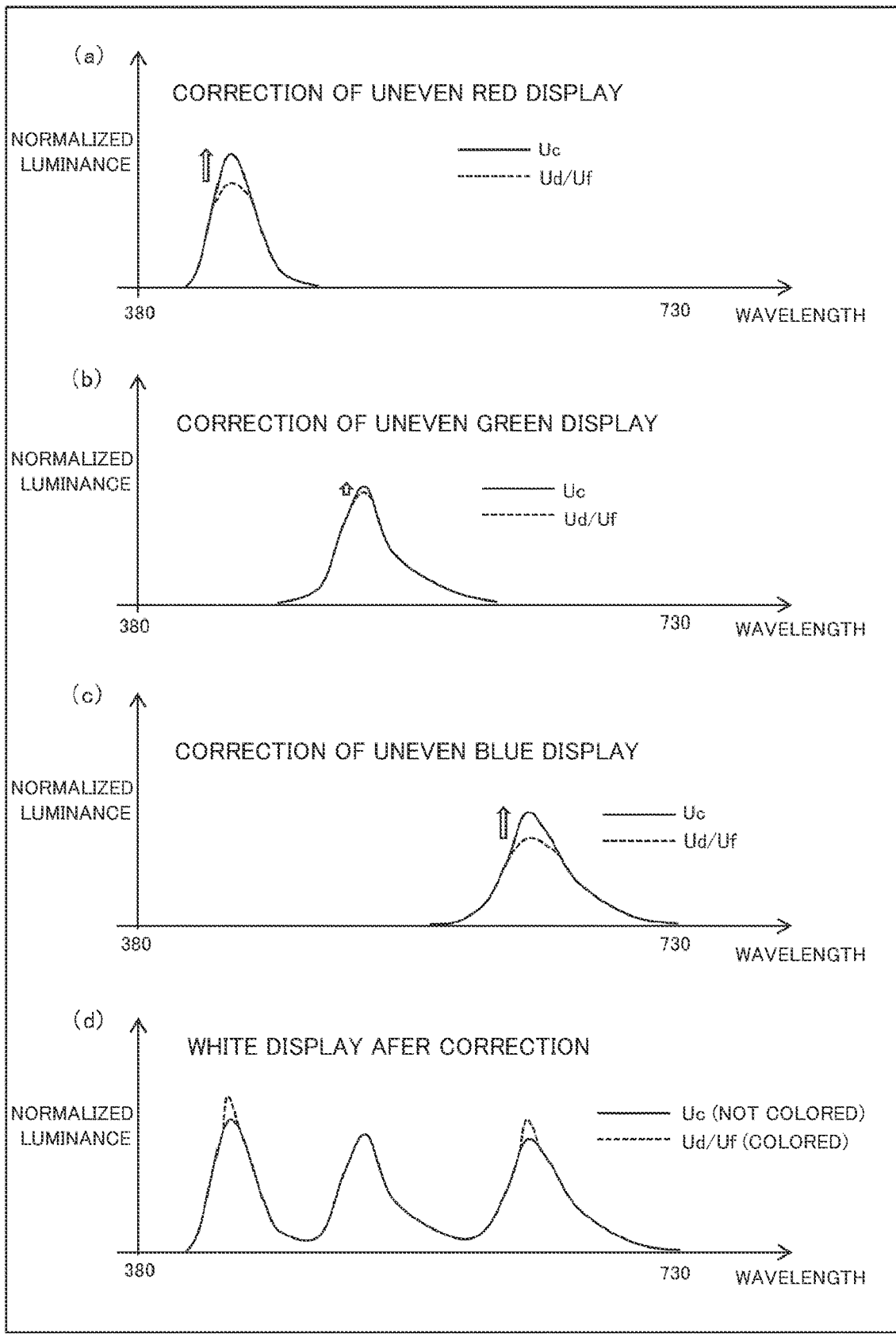
FIG. 5 is a set of graphs illustrating how to correct an uneven display.

FIG. 4 is a set of timing charts representing a driving scheme for producing a monotonous display in a display area. FIG. 5 is a set of graphs illustrating how to correct an uneven display. A data signal of an AC waveform (dark or bright) is fed to the first data signal line D1c to produce a monotonous red display as shown in FIG. 4(a) or a monotonous blue display as shown in FIG. 4(b). The voltage waveform on the first data signal line D1c is therefore distorted due to the parasitic resistance and capacitance of the first data signal line D1c as indicated by a broken line. On the other hand, to produce a monotonous green display as shown in FIG. 4(c), a data signal of a DC waveform (bright) is fed to the second data signal line D2c. The voltage waveform on the second data signal line D2c is therefore not distorted. For these reasons, even if the red data signal is corrected in a monotonous red display, the blue data signal is corrected in a monotonous blue display, and the green data signal is corrected in a monotonous green display, the white balance is in some cases still not properly adjusted (e.g., red and blue light shifts toward the high luminance end) in a monotonous white display in such a manner that the display may appear colored (e.g., the display may appear purplish) because in a monotonous white display, a data signal of a DC waveform (bright) is fed to the first data signal line D1c, and the voltage waveform on the first data signal line D1c is not distorted as shown in FIG. 4(d).

For instance, the groups Ud and Uf, when compared with the group Uc, involve longer routing in the frame area NA as shown in FIG. 3 and cause less distortion in the AC waveform of the data signal. Therefore, supposing that all the capacitive elements in the pixel circuits (for red, green, and blue light emission) have an equal capacitance value across the entire display area, the red data signal and the blue data signal are corrected by a greater quantity in the groups Ud and Uf as shown in FIG. 5(a) to (c) when the luminance of the groups Ud and Uf is corrected to match the luminance of the group Uc for each color.

Accordingly, in a white display produced after the correction for all the three colors, the white balance is still not properly adjusted (red and blue light shifts toward the high luminance end) due to the DC waveform of the data signal on the first data signal line. The shift is greater, and the display can appear more colored (e.g., the display can appear more purplish), in the groups Ud and Uf, where the red and blue data signals are corrected by a greater quantity, than in the group Uc as shown in FIG. 5(d).

As described in the foregoing, the display appears colored (purplish) in a white display along or near the edges of the display area (in the groups Ud and Uf) after the red, blue, and green data signals are all corrected, because the effective voltage level of the data signal fed to the capacitive element Cp varies greatly (even for the same gray level) between a monotonous display where a signal of an AC waveform is fed and a white display where a signal of a DC waveform is fed.

Figure 6:
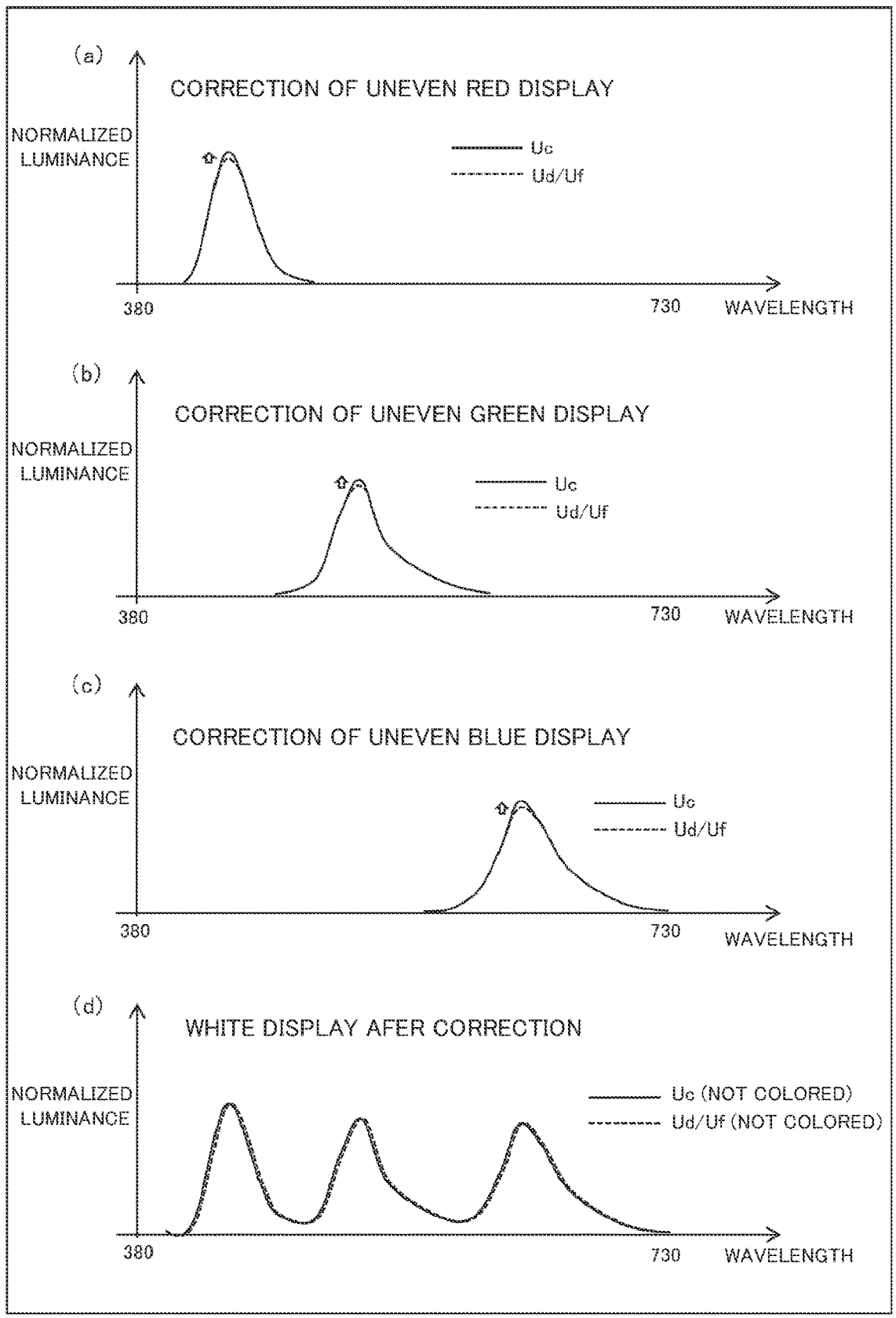
FIG. 6 is a set of graphs illustrating effects of Embodiment 1.

FIG. 6 is a set of graphs illustrating effects of Embodiment 1.

In Embodiment 1, the capacitive element Cp in the first pixel circuit R1 have a larger capacitance value in the groups Ud and Uf, which are farther in the row direction from the center of the display area (closer to an edge of the display area), than in the group Uc, which is closer to the center of the display area. This particular structure reduces the difference between the effective voltage level of the data signal fed for a monotonous red display (AC waveform) and the effective voltage level of the data signal fed for a white display (DC waveform) as shown in FIGS. 6(a) and (d). The structure hence restrains coloring along and near the edges of the display area (in the groups Ud and Uf).

A description is given next of quantitative analysis of a distorted data signal leasing to coloring along or near the edges of the display area. Letting r be the flow path resistance in applying a voltage across the capacitive element Cp, c be the capacitance value, and t be the scan period during which the write transistor is ON, the voltage V(Vj) applied across the capacitive element Cp is given by the following expression, where Vj is a data voltage and Vini is an initialization voltage.

Assuming that the data signal is distorted, $$V(Vj)=Vj+(Vini-Vj)\times\exp(-t/(r\times c))$$

Letting Vf be the voltage across the capacitive element Cp in the first pixel circuit in the group Uf and Vc be the voltage across the capacitive element Cp in the first pixel circuit in the group Uc, it then follows that $$Vf(Vj)=Vj+(Vini-Vj)\times\exp(-t/(r\times c))$$

$$Vc(Vj)=Vj+(Vini-Vj)\times\exp(-t/(r\times c))$$

By plugging Vj−ΔV into Vj as an uneven color display correction, the following relation by an uneven color display correction is derived.

$$Vf(Vj-\Delta V)=Vc(Vj)$$

Hence, $\Delta V=(Vf-Vc)/(1-\exp(-t/(r\times c)))$ where Vf is a voltage prior to the uneven display correction, that is, Vf(Vj).

When data signal lines are extended as far as immediately short of the display area DA, the routing line connected to a data signal line on an edge of the display area is longer than the routing line connected to a data signal line in the center of the display area, and r and c increase. Therefore, the data signal is increasingly distorted closer to the edge of the display area. Letting V0 be a desirable red data voltage, V2 be a central red voltage, and V1 be an edge red voltage, it holds that V0<V2<V1 because the waveform is more distorted closer to the edge of the display area. It then follows, as a result of an uneven color display correction, that:

$$\Delta V=V1-V0>0, \text{ and}$$

$$Vf(Vj)=Vf(V1-\Delta V)=Vc(V2).$$

In a monotonous red display after an uneven color display correction, the red data signal has a voltage level equal to the desirable data voltage V0 both on the edge and in the center. It hence follows that Vf(Vj)=Vf(V0−ΔV).

Meanwhile, the voltage for the center is given by Vc(Vj) =Vc(V0). Because V0−(V0−ΔV)=V1−V2>0, the voltage is decreased, and a brighter display is produced, which enhances red (producing a reddish display), on the edge of the display area.

Figure 7:
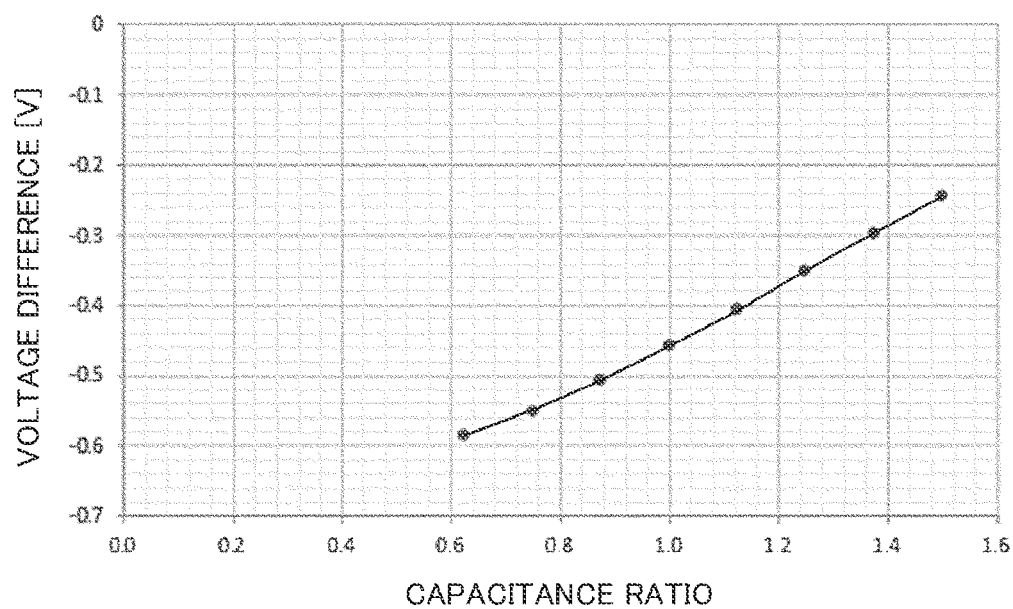
FIG. 7 is a graph representing voltage differences across capacitive elements in different groups.

FIG. 7 is a graph representing voltage differences (Vf−Vc) across capacitive elements in different groups. A simulation was performed assuming that the capacitance ratio was equal to the capacitance value of R1 in the group Uf divided by the capacitance value of R1 in the group Uc (100 fF), V0=3.0 (volts), wiring resistance r=8M Ω, and t=2 μs. FIG. 7 demonstrates that by increasing the capacitance value in the group Uf beyond the capacitance in the group Uc, voltage differences are eliminated, and the excess redness is reduced.

In this working example, all the capacitive elements Cp in the first pixel circuits R1 in the groups Ud and Uf need only to have a common (equal) capacitance value that is larger than the capacitance value of the capacitive element Cp in the first pixel circuit R1 in the group Uc.

The capacitance values in the third and fourth pixel circuits G3 and G4 which emit green light may be common (equal) across all groups. In other words, in FIG. 3, the capacitive elements Cp in the third pixel circuits G3 in the groups Uc, Ud, and Uf connected to the common, first scan signal line Gn and the capacitive elements in the fourth pixel circuits G4 in the groups Uc, Ud, and Uf connected to the common, second scan signal line Gn+1 have a common (equal) capacitance value. In addition, in the groups Ud and Uf, which are farther in the row direction from the center of the display area, the capacitive element Cp in the first pixel circuit R1 has a larger capacitance value than does the capacitive element Cp in the third pixel circuit G3.

The capacitance values may be common (equal) in the second pixel circuits B2 in different groups because human sensitivity to luminance decreases in the sequence of green, red, and blue, and large improvements are expected if the capacitance value of the first pixel circuit R1 is changed. In such cases, the capacitive elements Cp in the second pixel circuit B2, the third pixel circuit G3, and the fourth pixel circuit G4 may have an equal capacitance value.

The capacitive elements Cp in the first pixel circuits R1, the second pixel circuits B2, the third pixel circuits G3, and the fourth pixel circuits G4 in the groups Uc, which are closer to the center of the display area, may have a common (equal) capacitance value.

Figure 10:
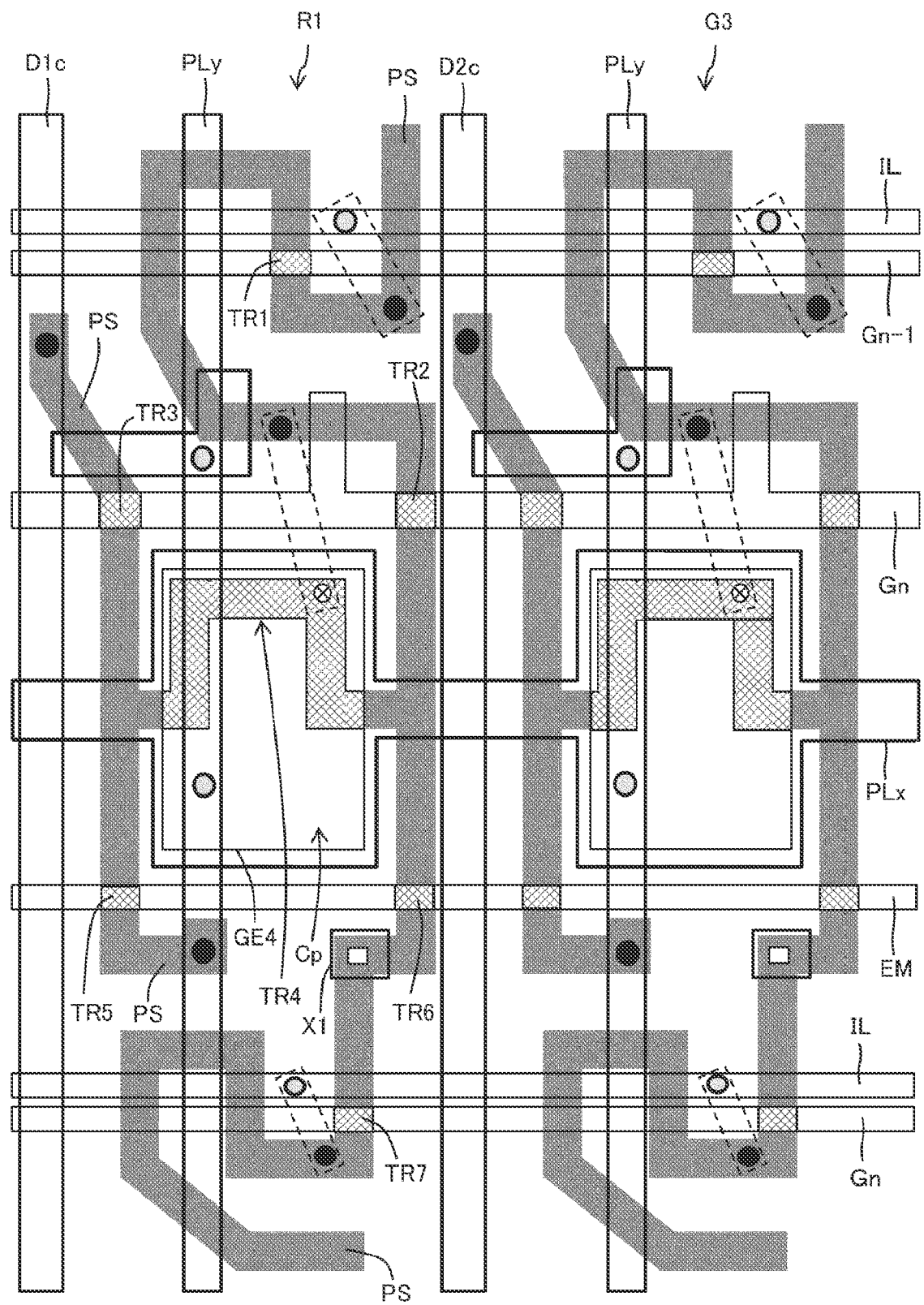
FIG. 10 is a plan view of an exemplary structure of a pixel circuit in accordance with Embodiment 1.
Figure 11:
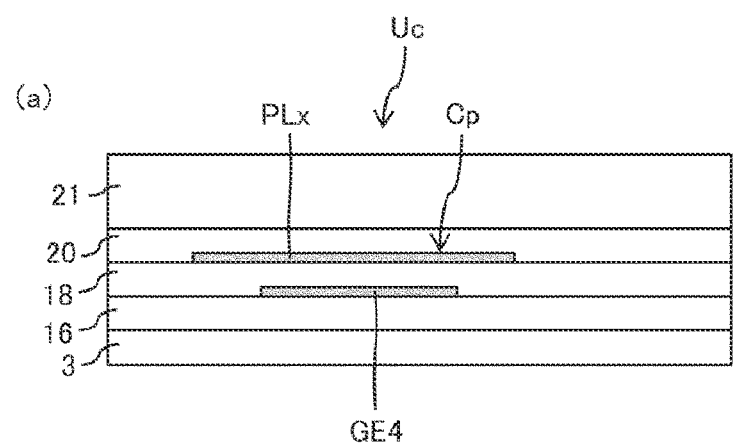
FIG. 11 is a set of cross-sectional views of an exemplary structure of a pixel circuit in accordance with Embodiment 1.
Figure 11:
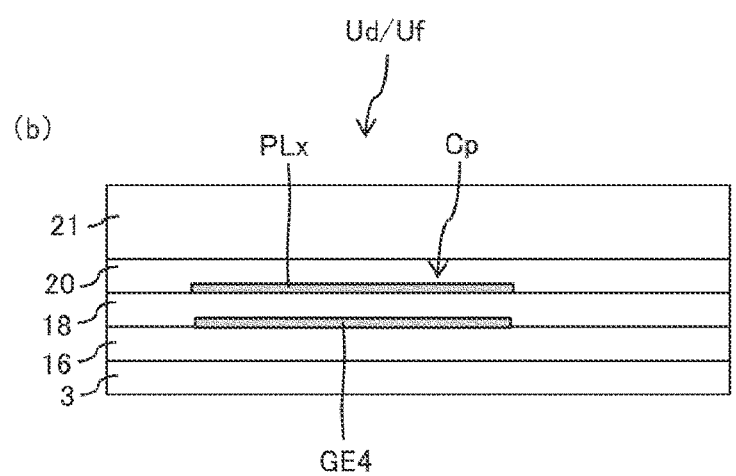

FIG. 10 is a plan view of an exemplary structure of a pixel circuit in accordance with Embodiment 1. FIG. 11 is a set of cross-sectional views of an exemplary structure of a pixel circuit in accordance with Embodiment 1. In FIGS. 10 and 11, the first data signal line D1c, the second data signal line D2c, the two first scan signal lines Gn, two high-voltage power supply lines PLx and PLy, and the two initialization power supply lines IL are provided in association with the first pixel circuit R1 and the third pixel circuit G3.

The first scan signal line Gn, the light-emission control line EM, and the gate electrode GE4 of the drive transistor TR4 reside in the first wiring layer. The initialization power supply line IL and the row-wise extending, high-voltage power supply line PLx reside in the second wiring layer. The first data signal line D1c, the second data signal line D2c, and the column-wise extending, high-voltage power supply line PLy reside in the third wiring layer. The portions of the semiconductor layer PS that overlap the first wiring layer (e.g., the first scan signal line Gn, the light-emission control line EM, and the gate electrode GE4 of the drive transistor TR4) are made of a semiconductor and serve as the channels of the transistors, and the portions that do not overlap are doped so as to be a conductor.

FIG. 11(a) is a cross-sectional view of the capacitive element Cp in the first pixel circuit R1 in the group Uc, and FIG. 11(b) is a cross-sectional view of the capacitive element Cp in the first pixel circuit R1 in the groups Ud and Uf. The capacitive element Cp resides where the gate electrode GE4 overlaps the high-voltage power supply line PLx. The capacitance value can be changed by, for example, varying the overlapping area of the gate electrode GE4 and the high-voltage power supply line PLx. The capacitance value can be increased by increasing the overlapping area.

Variation Example 1

Figure 8:
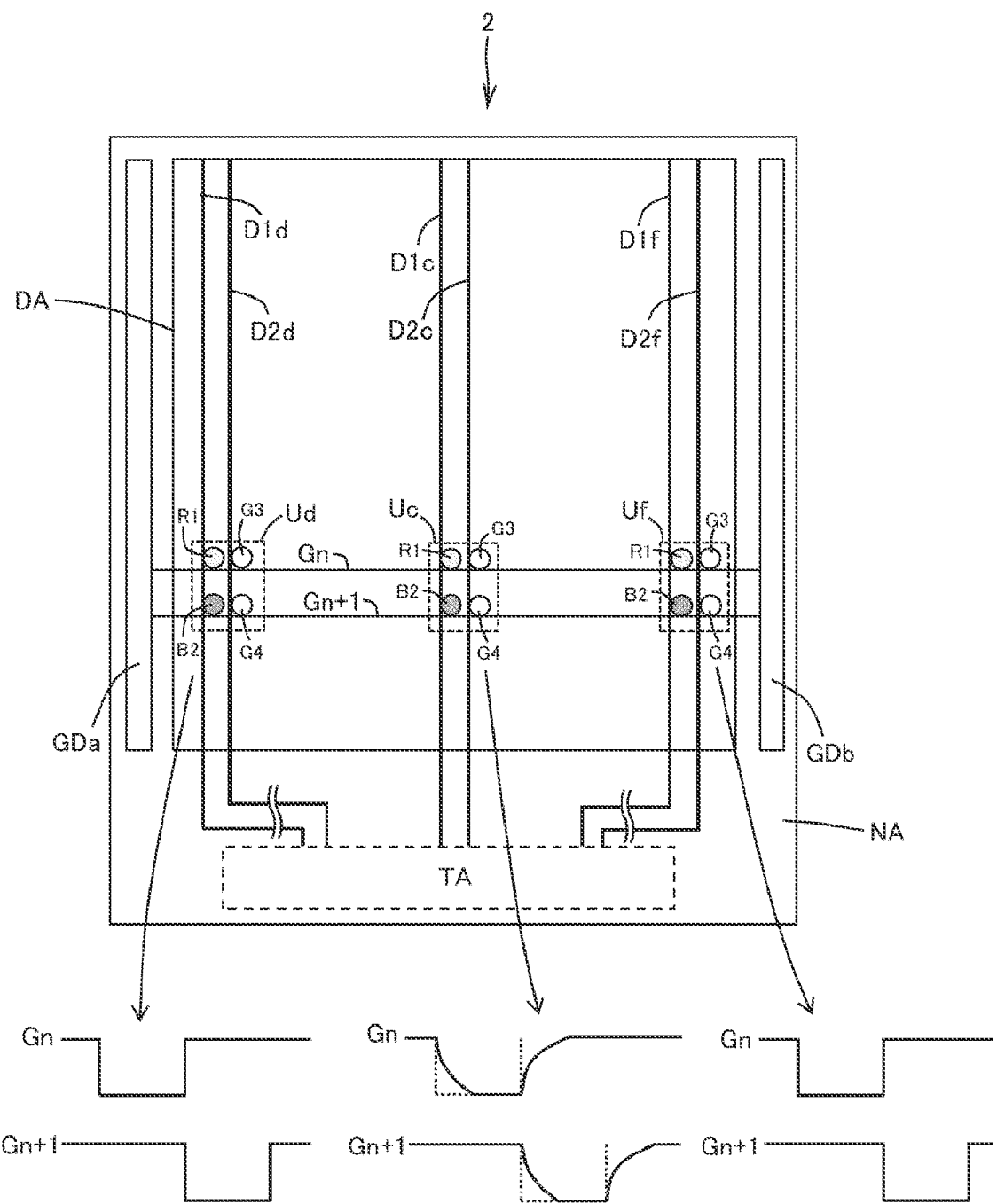
FIG. 8 is a diagram of a structure of a display device in accordance with Variation Example 1 and scan signal waveforms in the display device.

FIG. 8 is a diagram of a structure of a display device in accordance with Variation Example 1 and scan signal waveforms in the display device. It may be inferred that excess redness occurs by the following mechanism. Referring to FIG. 8, a comparison of the groups Uc, Ud, and Uf shows that the waveform of the scan signal changes more abruptly (the gate pulse is less distorted) in the groups Ud and Uf, which are closer to the scan control circuits GDa and GDb, than in the group Uc, which is farther from the scan control circuits GDa and GDb. In other words, the practical writing period is longer in the groups Ud and Uf than in the group Uc. Since the AC waveform of the data signal is distorted in the groups Uc, Ud, and Uf as described earlier, the effective voltage is shifted toward high voltage end (toward the dark end) due to the distortion in the groups Ud and Uf, so that the distorted effective voltage is written over an extended period of time (in comparison with the group Uc). This extended writing period further increases the amount of red correction. Therefore, red light shifts more toward the high luminance end in a white display after the correction.

In Variation Example 1, the capacitive element Cp in the first pixel circuit R1 belonging to the group Ud and connected to the first scan signal line Gn and the capacitive element Cp in the first pixel circuit R1 belonging to the group Uf and connected to the first scan signal line Gn have a larger capacitance value than does the capacitive element Cp in the first pixel circuit R1 belonging to the group Uc and connected to the first scan signal line Gn. The group Uc is located farther in the row direction from the scan control circuits GDa and GDb. The groups Ud and Uf are located closer in the row direction to the scan control circuits GDa and GDb. Difference is therefore further reduced between the effective voltage of the data signal fed for a monotonous red display (AC waveform) and the effective voltage of the data signal fed for a white display (DC waveform), which in turn further restrains coloring along the edge of the display area (in the groups Ud and Uf).

A description is given next of quantitative analysis of coloring caused by the distorted scan signal along the edge of the display area. If a data signal V3 (V3>V0) is fed apparently to a data signal line residing along the edge of the display area and a data signal line residing in the center, $$Vf(V3)=Vj+(Vini-V3)\times\exp(-t/(r\times c))$$

$$Vc(V3)=Vj+(Vini-V3)\times\exp(-t'/(r\times c))$$

where t'<t, which indicates that the ON period of the write transistor in the first pixel circuit in the center is reduced apparently by the distortion of the scan signal. ΔV after an uneven color display correction is calculated as in the following.

$$Vf(V3-\Delta V)=Vc(V3)$$

$$\Delta V=(Vf(V3)-(Vc(V3))/(1-\exp(-t/(r\times c)))$$

In a monotonous display after an uneven color display correction, the R voltage data on the data signal line is equal to the desirable data voltage V0 both on the edge of the display area and in the center.

$$Vf(V0-\Delta V)=Vj+(Vini-V0)\times\exp(-t/(r\times c))$$

$$Vc(V0)=Vj+(Vini-V3)\times\exp(-t'/(r\times c))$$

$$Vf(V0-\Delta V)-Vc(V0)=$$
$$Vf(V0)-Vc(V0)-\Delta V\times(1-\exp(-t/(r\times c)))=$$
$$Vf(V0)-Vf(V3)-((Vc(V0)-Vc(V3))=$$
$$(V0-V3)\times[\exp(-t/(r\times c))-\exp(-t'/(r\times c))]<0$$

Hence, the voltage is decreased, and a brighter display is produced, which enhances red (producing a reddish display), on the edge of the display area.

Figure 9:
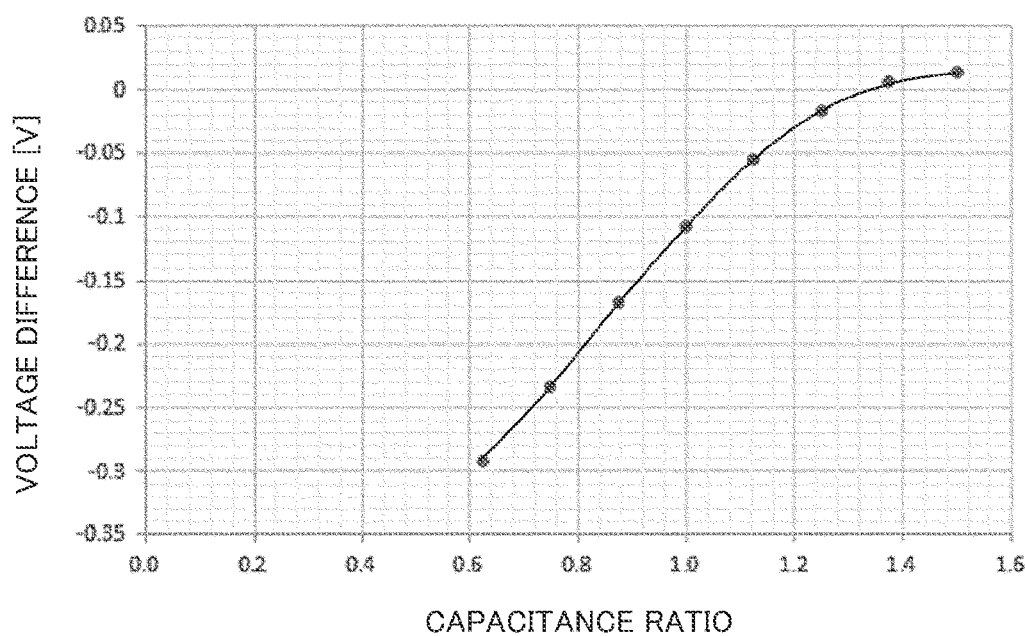
FIG. 9 is a graph representing voltage differences across capacitive elements in different groups.

FIG. 9 is a graph representing voltage differences (Vf–Vc) across capacitive elements in different groups. A simulation was performed assuming that the capacitance ratio was equal to the capacitance value of R1 in the group Uf divided by the capacitance value of R1 in the group Uc (100 fF), V0=3.0 (volts), wiring resistance r=8M Ω, and t=2 μs.

FIG. 9 demonstrates that by increasing the capacitance value in the group Uf beyond the capacitance in the group Uc, voltage differences are eliminated, the excess redness is reduced, and the capacitance ratio has an upper limit of 1.5.

The capacitive elements Cp in the first pixel circuits R1 in the groups Ud and Uf, which are closer in the row direction to scan control circuits Ga and Gb, have a larger capacitance value than do the capacitive elements Cp in the third pixel circuit G3 and the fourth pixel circuit G4.

When the capacitance values of the capacitive elements Cp are compared between those pixel circuits which are closer to the scan control circuits Ga and Gb and those pixel circuits which are farther from the scan control circuits Ga and Gb, the capacitance values are compared basically between those pixel circuits which are connected to a common, first scan signal line.

Variation Example 2

Similarly to the first pixel circuits R1, the capacitance value in the second pixel circuit B2 may be varied from one group to the other, which further restrains coloring along the edge of the display area (groups Ud and Uf).

In FIG. 3, the capacitive elements Cp in the second pixel circuits B2 in the groups Ud and Uf, which are farther in the row direction from the center of the display area, have a larger capacitance value than does the capacitive element Cp in the second pixel circuit B2 in the group Uc, which is closer in the row direction to the center of the display area. Difference is therefore reduced between the effective voltage of the data signal fed for a monotonous blue display (AC waveform) and the effective voltage of the data signal fed for a white display (DC waveform) as shown in FIGS. 6(c) and 8(d), which in turn restrains coloring along the edge of the display area (groups Ud and Uf).

In the groups Ud and Uf, which are farther in the row direction from the center of the display area, the capacitive element Cp in the second pixel circuit B2 has a larger capacitance value than do the capacitive elements Cp in the third pixel circuit G3 and the fourth pixel circuit G4.

In the groups Ud and Uf, which are farther in the row direction from the center of the display area, the capacitive element Cp in the first pixel circuit R1 may have the same capacitance value as does the capacitive element Cp in the second pixel circuit B2.

The capacitive element Cp in the first pixel circuit R1 may have a larger capacitance value than do the capacitive elements Cp in the second pixel circuits B2 in the groups Ud and Uf, which are farther in the row direction from the center of the display area, because sensitivity to luminance is higher for red than for blue.

Variation Example 3

In FIG. 8, similarly to the description in Variation Example 1, the capacitive elements Cp in the second pixel circuits B2 in the groups Ud and Uf, which are closer in the row direction to the scan control circuits Ga and Gb, have a larger capacitance value than does the capacitive element Cp in the second pixel circuit B2 in the group Uc, which is farther from the scan control circuits Ga and Gb. Difference is therefore reduced between the effective voltage of the data signal fed for a monotonous blue display (AC waveform) and the effective voltage of the data signal fed for a white display (DC waveform), which in turn restrains coloring along the edge of the display area (in the groups Ud and Uf).

In the groups Ud and Uf, which are closer in the row direction to the scan control circuits Ga and Gb, the capacitive element Cp in the second pixel circuit B2 has a larger capacitance value than do the capacitive elements Cp in the third pixel circuit G3 and the fourth pixel circuit G4.

In the groups Ud and Uf, which are closer in the row direction to the scan control circuits Ga and Gb, the capacitive element Cp in the first pixel circuit R1 may have the same capacitance value as does the capacitive element Cp in the second pixel circuit B2.

The capacitive element Cp in the first pixel circuit R1 may have a larger capacitance value than do the capacitive elements Cp in the second pixel circuits B2 in the groups Ud and Uf, which are closer in the row direction to the scan control circuits Ga and Gb, because sensitivity to luminance is higher for red than for blue.

Variation Example 4

In FIG. 3, the capacitive elements Cp in the first pixel circuits R1 may have a capacitance value that decreases with an increasing distance in the row direction from the edge of the display area because excess redness is more recognizable closer to the edge. In addition, the capacitive elements Cp in the first pixel circuits R1 may have a capacitance value that decreases with an increasing distance in the row direction from the scan control circuits Ga and Gb.

Variation Example 5

In FIG. 3, the capacitive elements Cp in the second pixel circuits B2 may have a capacitance value that decreases with an increasing distance in the row direction from the edge of the display area. In addition, the capacitive elements Cp in the second pixel circuits B2 may have a capacitance value that decreases with an increasing distance in the row direction from the scan control circuits GS and Gb.

Embodiment 2

Figure 12:
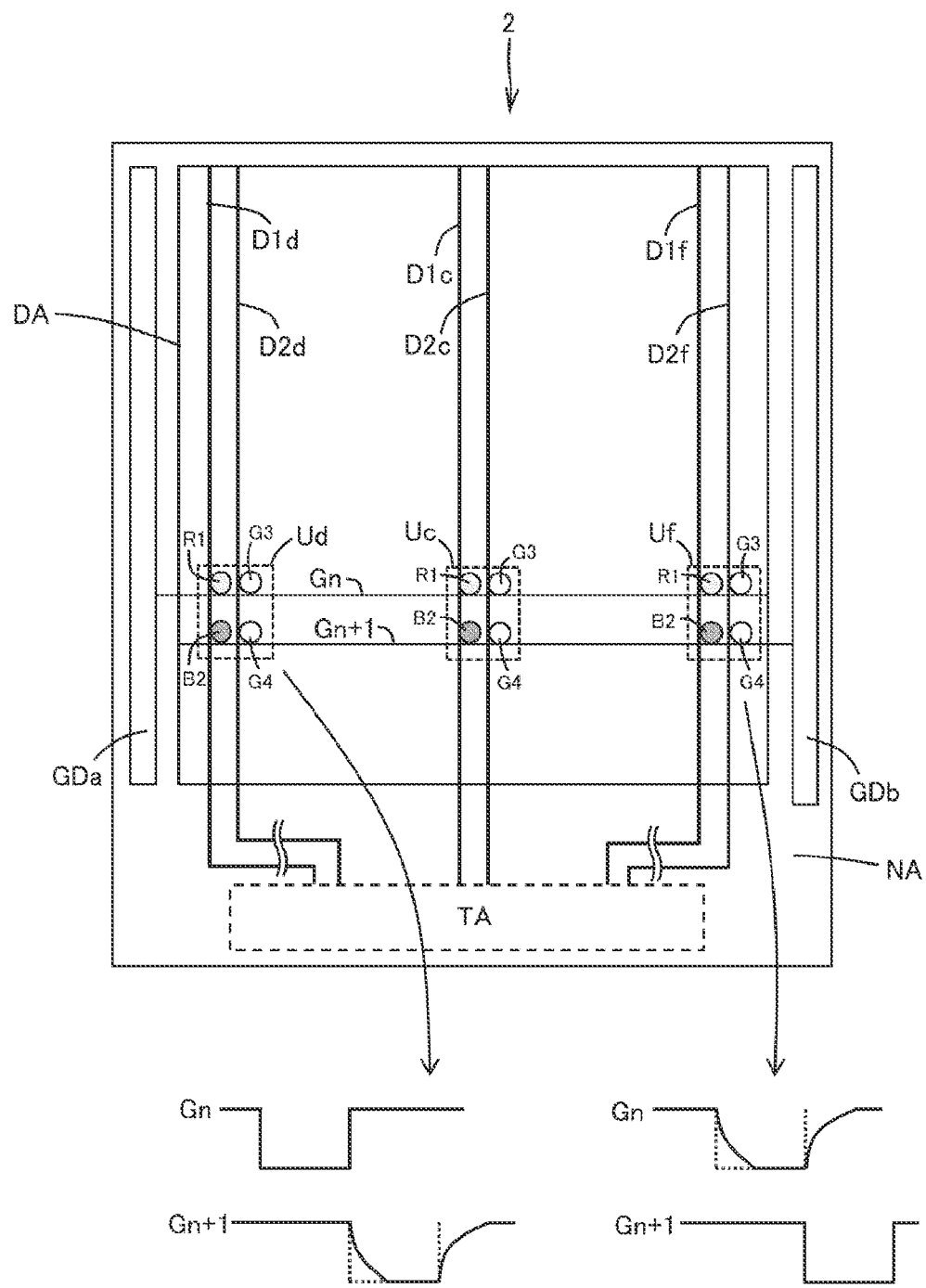
FIG. 12 is a diagram of a structure of a display device in accordance with Embodiment 2 and scan signal waveforms in the display device.

FIG. 12 is a diagram of a structure of a display device in accordance with Embodiment 2 and scan signal waveforms in the display device. The ends of the first scan signal line Gn and the ends of the second scan signal line Gn+1 are connected respectively to the two scan control circuits GDa and GDb sandwiching the display area DA in Embodiment 1. In contrast, in Embodiment 2, as shown in FIG. 12, the first scan signal line Gn is connected to the scan control circuit GDa, and the second scan signal line Gn+1 is connected to the scan control circuit GDb.

Of the groups Uc, Ud, and Uf, the group Uc is located closer in the row direction to the center of the display area, and the groups Ud and Uf are located farther in the row direction from the center of the display area. In other words, of the groups Uc, Ud, and Uf, the group Uc is located farther from the edges of the display area when viewed in the row direction, and the groups Ud and Uf are located closer to an edge of the display area when viewed in the row direction. Meanwhile, the group Uc is located farther from the scan control circuits GDa and GDb when viewed in the row direction, the group Ud is located closer to the scan control circuit GDa when viewed in the row direction, and Uf is located closer to the scan control circuit GDb when viewed in the row direction. For instance, when L=5120, K=3200, and the resolution is 300 ppi as an example, the pixel circuits that are located farther in the row direction from the center of the display area, or closer in the row direction to the scan control circuit GDa, may be in some cases roughly referring to those pixel circuits (including the group Ud) in the first to 100th columns as counted from an edge of the display area. The pixel circuits that are located farther in the row direction from the center of the display area, or closer in the row direction to the scan control circuit GDb, may be in some cases roughly referring to those pixel circuits (including the group Uf) in the (K−99)-th to K-th columns. The pixel circuits that are located closer in the row direction to the center of the display area, or farther in the row direction from the scan control circuits GDa and GDb, may be in some cases roughly referring to those pixel circuits (including the group Uc) in the 101th to (K−100)-th columns.

Of the first pixel circuits R1 that are in the different groups Ud, Uc, and Uf and connected to the first scan signal line Gn, the capacitive element Cp in the first pixel circuit R1 that is closer in the row direction to the scan control circuit GDa (the first pixel circuit R1 in the groups Ud) has a larger capacitance value than do the capacitive elements Cp in the first pixel circuits R1 that are farther in the row direction from the scan control circuit GDb (the first pixel circuits R1 in the groups Uc and Uf). The capacitive element Cp in the first pixel circuit R1 in the group Uc may have the same capacitance value as does the capacitive element Cp in the first pixel circuit R1 in the group Uf.

In addition, of the second pixel circuits B2 that are in the different groups Uc, Ud, and Uf and connected to the second scan signal line Gn+1, the capacitive element Cp in the second pixel circuit B2 that is closer in the row direction to the scan control circuit GDb (the second pixel circuit B2 in the group Uf) has a larger capacitance value than do the capacitive elements Cp in the second pixel circuits B2 that are farther in the row direction from the scan control circuit GDb (the second pixel circuits B2 in the groups Ud and Uc). The capacitive element Cp in the second pixel circuit B2 in the group Ud may have the same capacitance value as the capacitive element Cp in the second pixel circuit B2 in the group Uc.

In the group Ud, the capacitive element Cp in the first pixel circuit R1 may have a larger capacitance value than do the capacitive elements Cp in the second pixel circuit B2, the third pixel circuit G3, and the fourth pixel circuit G4. In addition, in the group Uf, the capacitive element Cp in the second pixel circuit B2 may have a larger capacitance value than do the capacitive elements Cp in the first pixel circuit R1, the third pixel circuit G3, and the fourth pixel circuit G4.

The capacitive element Cp in the first pixel circuit R1 in the group Ud, which is located closer in the row direction to the scan control circuit GDa, may have the same capacitance value as does the capacitive element Cp in the second pixel circuit B2 in the group Uf, which is located closer in the row direction to the scan control circuit GDb.

The capacitive element Cp in the third pixel circuit G3 may have the same capacitance value as does the capacitive element Cp in the fourth pixel circuit G4 across the entire display area DA.

In the group Uc, which is located closer in the row direction to the center of the display area, the capacitive elements Cp in the first pixel circuit R1, the second pixel circuit B2, the third pixel circuit G3, and the fourth pixel circuit G4 may have an equal capacitance value.

Furthermore, the capacitive elements Cp in the first pixel circuits R1 connected to the first scan signal line Gn may have a capacitance value that decreases with an increasing distance from the scan control circuit GDa. The capacitive elements Cp in the second pixel circuits B2 connected to the second scan signal line Gn+1 may have a capacitance value that decreases with an increasing distance from the scan control circuit GDb.

In Embodiment 2, the first scan signal line Gn may be connected to the scan control circuit GDb, and the second scan signal line Gn+1 may be connected to the scan control circuit GDa.

The embodiments and examples described so far are for illustrative purposes only and by no means limit the scope of the disclosure. It is obvious to the person skilled in the art that many modifications and variations are possible based on the description.

Aspect 1

A display device having a display area, a frame area, and a terminal area along an edge of the frame area, the display device including:

a plurality of data signal lines extending in a column direction;

a plurality of scan signal lines extending in a row direction so as to intersect with the plurality of data signal lines;

a scan control circuit in the frame area along at least one of column-wise extending edges of the display area, the scan control circuit being configured to feed a scan signal to the plurality of scan signal lines; and a plurality of pixel circuits each associated with a different one of intersections of the plurality of data signal lines and the plurality of scan signal lines, each of the plurality of pixel circuits including: a light-emitting element; a drive transistor configured to control a current in the light-emitting element; and a capacitive element connected to a control terminal of the drive transistor to retain a data voltage, wherein the plurality of pixel circuits includes a plurality of groups each including: a first pixel circuit configured to emit light of a first color; a second pixel circuit located adjacent to the first pixel circuit and configured to emit light of a second color that differs from the first color; a third pixel circuit located adjacent to the first pixel circuit and configured to emit light of a third color that differs from the first color and the second color; and a fourth pixel circuit located adjacent to the third pixel circuit and configured to emit light of the third color, In each of the plurality of groups, the first pixel circuit and the second pixel circuit are connected to a first data signal line, the third pixel circuit and the fourth pixel circuit are connected to a second data signal line, the first pixel circuit and the third pixel circuit are connected to a first scan signal line, and the second pixel circuit and the fourth pixel circuit are connected to a second scan signal line, and of those two of the first pixel circuits which are included in different ones of the plurality of groups and connected to a common one of the first scan signal lines, the capacitive element in the first pixel circuit that is located farther in the row direction from a center of the display area has a larger capacitance value than does the capacitive element in the first pixel circuit that is located closer in the row direction to the center of the display area.

Aspect 2

The display device of, for example, aspect 1, wherein of those two of the first pixel circuits which are included in different ones of the plurality of groups and connected to a common one of the first scan signal lines, the capacitive element in the first pixel circuit that is located closer in the row direction to the scan control circuit has a larger capacitance value than does the capacitive element in the first pixel circuit that is located farther in the row direction from the scan control circuit.

Aspect 3

The display device of, for example, aspect 2, wherein in those of the plurality of groups which include the first pixel circuit that is located closer in the row direction to the scan control circuit, the capacitive element in the first pixel circuit and the capacitive element in the second pixel circuit have an equal capacitance value.

Aspect 4

The display device of, for example, aspect 3, wherein in those of the plurality of groups which include the first pixel circuit that is located closer in the row direction to the scan control circuit, the capacitive element in the first pixel circuit has a larger capacitance value than does the capacitive element in the third pixel circuit.

Aspect 5

The display device of, for example, aspect 2, wherein in those of the plurality of groups which include the first pixel circuit that is located closer in the row direction to the scan control circuit, the capacitive element in the first pixel circuit has a larger capacitance value than does the capacitive element in the second pixel circuit.

Aspect 6

The display device of, for example, aspect 5, wherein in those of the plurality of groups which include the first pixel circuit that is located closer in the row direction to the scan control circuit, the capacitive element in the second pixel circuit has a larger capacitance value than does the capacitive element in the third pixel circuit.

Aspect 7

The display device of, for example, aspect 1, wherein of those two of the second pixel circuits which are included in different ones of the plurality of groups and connected to a common one of the second scan signal lines, the capacitive element in the second pixel circuit that is located farther in the row direction from the center of the display area has a larger capacitance value than does the capacitive element in the second pixel circuit that is located closer in the row direction to the center of the display area.

Aspect 8

The display device of, for example, aspect 5, wherein of those two of the second pixel circuits which are included in different ones of the plurality of groups and connected to a common one of the second scan signal lines, the capacitive element in the second pixel circuit that is located closer in the row direction to the scan control circuit has a larger capacitance value than does the capacitive element in the second pixel circuit that is located farther in the row direction from the scan control circuit.

Aspect 9

The display device of, for example, any one of aspects 1 to 8, wherein in those of the plurality of groups which are located in the center of the display area when viewed in the row direction, the capacitive element in the first pixel circuit and the capacitive element in the third pixel circuit have an equal capacitance value.

Aspect 10

The display device of, for example, any one of aspects 1 to 9, wherein the capacitive elements in those of the first pixel circuits which are connected to a common one of the first scan signal lines have a capacitance value that decreases with an increasing distance in the row direction from the scan control circuit.

Aspect 11

The display device of, for example, any one of aspects 1 to 10, wherein the capacitive elements in those of the second pixel circuits which are connected to a common one of the second scan signal lines have a capacitance value that decreases with an increasing distance in the row direction from the scan control circuit.

Aspect 12

The display device of, for example, any one of aspects 1 to 11, wherein the capacitive elements in those of the third pixel circuits which are included in different ones of the plurality of groups and connected to a common one of the first scan signal lines and the capacitive elements in those of the fourth pixel circuits which are included in different ones of the plurality of groups and connected to a common one of the second scan signal lines have an equal capacitance value.

Aspect 13

The display device of, for example, any one of aspects 1 to 12, including: a scan control circuit on one of two column-wise extending edges of the display area; and another scan control circuit on another one of the two column-wise extending edges, these two scan control circuits sandwiching the display area therebetween, wherein
the first scan signal lines each have an end connected to one of the two scan control circuits and another end connected to the other one of the two scan control circuits, and
of those of the first pixel circuits which are included in different ones of the plurality of groups and connected to a common one of the first scan signal lines, the capacitive element in the first pixel circuit that is located farther in the row direction from the two scan control circuits have a smaller capacitance value than do the capacitive element in the first pixel circuit that is located closer in the row direction to the one of the two scan control circuits and the capacitive element in the first pixel circuit that is located closer in the row direction to the other one of the two scan control circuits.

Aspect 14

The display device of, for example, any one of aspects 1, 2, and 8, including: a scan control circuit on one of two column-wise extending edges of the display area; and another scan control circuit on another one of the two column-wise extending edges, these two scan control circuits sandwiching the display area therebetween, wherein
the first scan signal lines are connected to the one of the two scan control circuits,
the second scan signal lines are connected to the other one of the two scan control circuits, and
of those two of the first pixel circuits which are included in different ones of the plurality of groups and connected to a common one of the first scan signal lines, the capacitive element in the first pixel circuit that is located closer in the row direction to the one of the two scan control circuits has a larger capacitance value than does the capacitive element in the first pixel circuit that is located closer in the row direction to the other one of the two scan control circuits.

Aspect 15

The display device of, for example, aspect 14, wherein in those of the plurality of groups which include the first pixel circuit that is located closer to the one of the two scan control circuits, the capacitive element in the first pixel circuit has a larger capacitance value than do the capacitive elements in the second pixel circuit, the third pixel circuit, and the fourth pixel circuit.

Aspect 16

The display device of, for example, aspect 14, wherein the capacitive element in one of the second pixel circuits in a same one of the plurality of groups as the first pixel circuit that is located closer to the other one of the two scan control circuits and the capacitive element in the first pixel circuit that is located closer to the one of the two scan control circuits have an equal capacitance value.

Aspect 17

The display device of, for example, any one of aspects 1 to 16, wherein the first color is red, the second color is blue, and the third color is green.

The invention claimed is:

1. A display device having a display area, a frame area, and a terminal area along an edge of the frame area, the display device comprising:
a plurality of data signal lines extending in a column direction;
a plurality of scan signal lines extending in a row direction so as to intersect with the plurality of data signal lines;
a scan control circuit in the frame area along at least one of column-wise extending edges of the display area, the scan control circuit being configured to feed a scan signal to the plurality of scan signal lines; and
a plurality of pixel circuits each associated with a different one of intersections of the plurality of data signal lines and the plurality of scan signal lines, each of the plurality of pixel circuits including: a light-emitting element; a drive transistor configured to control a current in the light-emitting element; and a capacitive element connected to a control terminal of the drive transistor to retain a data voltage, wherein
the plurality of pixel circuits includes a plurality of groups each including: a first pixel circuit configured to emit light of a first color; a second pixel circuit located adjacent to the first pixel circuit and configured to emit light of a second color that differs from the first color; a third pixel circuit located adjacent to the first pixel circuit and configured to emit light of a third color that differs from the first color and the second color; and a fourth pixel circuit located adjacent to the third pixel circuit and configured to emit light of the third color,
in each of the plurality of groups, the first pixel circuit and the second pixel circuit are connected to a first data signal line, the third pixel circuit and the fourth pixel circuit are connected to a second data signal line, the first pixel circuit and the third pixel circuit are connected to a first scan signal line, and the second pixel circuit and the fourth pixel circuit are connected to a second scan signal line, and of those two of the first pixel circuits which are included in different ones of the plurality of groups and connected to a common one of the first scan signal lines, the capacitive element in the first pixel circuit that is located farther in the row direction from a center of the display area has a larger capacitance value than does the capacitive element in the first pixel circuit that is located closer in the row direction to the center of the display area.

2. The display device according to claim 1, wherein of those two of the first pixel circuits which are included in different ones of the plurality of groups and connected to a common one of the first scan signal lines, the capacitive element in the first pixel circuit that is located closer in the row direction to the scan control circuit has a larger capacitance value than does the capacitive element in the first pixel circuit that is located farther in the row direction from the scan control circuit.

3. The display device according to claim 2, wherein in those of the plurality of groups which include the first pixel circuit that is located closer in the row direction to the scan control circuit, the capacitive element in the first pixel circuit and the capacitive element in the second pixel circuit have an equal capacitance value.

4. The display device according to claim 3, wherein in those of the plurality of groups which include the first pixel circuit that is located closer in the row direction to the scan control circuit, the capacitive element in the first pixel circuit has a larger capacitance value than does the capacitive element in the third pixel circuit.

5. The display device according to claim 2, wherein in those of the plurality of groups which include the first pixel circuit that is located closer in the row direction to the scan control circuit, the capacitive element in the first pixel circuit has a larger capacitance value than does the capacitive element in the second pixel circuit.

6. The display device according to claim 5, wherein in those of the plurality of groups which include the first pixel circuit that is located closer in the row direction to the scan control circuit, the capacitive element in the second pixel circuit has a larger capacitance value than does the capacitive element in the third pixel circuit.

7. The display device according to claim 5, wherein of those two of the second pixel circuits which are included in different ones of the plurality of groups and connected to a common one of the second scan signal lines, the capacitive element in the second pixel circuit that is located closer in the row direction to the scan control circuit has a larger capacitance value than does the capacitive element in the second pixel circuit that is located farther in the row direction from the scan control circuit.

8. The display device according to claim 1, wherein of those two of the second pixel circuits which are included in different ones of the plurality of groups and connected to a common one of the second scan signal lines, the capacitive element in the second pixel circuit that is located farther in the row direction from the center of the display area has a larger capacitance value than does the capacitive element in the second pixel circuit that is located closer in the row direction to the center of the display area.

9. The display device according to claim 1, wherein in those of the plurality of groups which are located in the center of the display area when viewed in the row direction, the capacitive element in the first pixel circuit and the capacitive element in the third pixel circuit have an equal capacitance value.

10. The display device according to claim 1, wherein the capacitive elements in those of the first pixel circuits which are connected to a common one of the first scan signal lines have a capacitance value that decreases with an increasing distance in the row direction from the scan control circuit.

11. The display device according to claim 1, wherein the capacitive elements in those of the second pixel circuits which are connected to a common one of the second scan signal lines have a capacitance value that decreases with an increasing distance in the row direction from the scan control circuit.

12. The display device according to claim 1, wherein the capacitive elements in those of the third pixel circuits which are included in different ones of the plurality of groups and connected to a common one of the first scan signal lines and the capacitive elements in those of the fourth pixel circuits which are included in different ones of the plurality of groups and connected to a common one of the second scan signal lines have an equal capacitance value.

13. The display device according to claim 1, comprising: a scan control circuit on one of two column-wise extending edges of the display area; and another scan control circuit on another one of the two column-wise extending edges, these two scan control circuits sandwiching the display area therebetween, wherein the first scan signal lines each have an end connected to one of the two scan control circuits and another end connected to the other one of the two scan control circuits, and of those of the first pixel circuits which are included in different ones of the plurality of groups and connected to a common one of the first scan signal lines, the capacitive element in the first pixel circuit that is located farther in the row direction from the two scan control circuits have a smaller capacitance value than do the capacitive element in the first pixel circuit that is located closer in the row direction to the one of the two scan control circuits and the capacitive element in the first pixel circuit that is located closer in the row direction to the other one of the two scan control circuits.

14. The display device according to claim 1, comprising: a scan control circuit on one of two column-wise extending edges of the display area; and another scan control circuit on another one of the two column-wise extending edges, these two scan control circuits sandwiching the display area therebetween, wherein the first scan signal lines are connected to the one of the two scan control circuits, the second scan signal lines are connected to the other one of the two scan control circuits, and of those two of the first pixel circuits which are included in different ones of the plurality of groups and connected to a common one of the first scan signal lines, the capacitive element in the first pixel circuit that is located closer in the row direction to the one of the two scan control circuits has a larger capacitance value than does the capacitive element in the first pixel circuit that is located closer in the row direction to the other one of the two scan control circuits.

15. The display device according to claim 14, wherein in those of the plurality of groups which include the first pixel circuit that is located closer to the one of the two scan control circuits, the capacitive element in the first pixel circuit has a larger capacitance value than do the capacitive elements in the second pixel circuit, the third pixel circuit, and the fourth pixel circuit.

16. The display device according to claim 14, wherein the capacitive element in one of the second pixel circuits in a same one of the plurality of groups as the first pixel circuit that is located closer to the other one of the two scan control circuits and the capacitive element in the first pixel circuit that is located closer to the one of the two scan control circuits have an equal capacitance value.

17. The display device according to claim 1, wherein the first color is red, the second color is blue, and the third color is green.

* * * * *